United States Patent
Ishikawa et al.

(10) Patent No.: US 10,234,762 B2
(45) Date of Patent: Mar. 19, 2019

(54) PATTERN-FORMING METHOD

(71) Applicant: JSR CORPORATION, Tokyo (JP)

(72) Inventors: Masayoshi Ishikawa, Tokyo (JP); Hiromitsu Tanaka, Tokyo (JP); Tomoharu Kawazu, Tokyo (JP); Junya Suzuki, Tokyo (JP); Tomoaki Seko, Tokyo (JP); Yoshio Takimoto, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/267,840

(22) Filed: Sep. 16, 2016

(65) Prior Publication Data
US 2017/0003592 A1    Jan. 5, 2017

Related U.S. Application Data

(63) Continuation of application No. PCT/JP2015/056437, filed on Mar. 4, 2015.

(30) Foreign Application Priority Data

Mar. 24, 2014    (JP) ................................ 2014-060959

(51) Int. Cl.
| | |
|---|---|
| G03F 7/36 | (2006.01) |
| G03F 7/09 | (2006.01) |
| H01L 21/311 | (2006.01) |
| G03F 7/075 | (2006.01) |
| G03F 7/42 | (2006.01) |
| G03F 7/16 | (2006.01) |
| G03F 7/40 | (2006.01) |
| H01L 21/027 | (2006.01) |

(52) U.S. Cl.
CPC ............ *G03F 7/0752* (2013.01); *G03F 7/094* (2013.01); *G03F 7/16* (2013.01); *G03F 7/405* (2013.01); *G03F 7/425* (2013.01); *H01L 21/0273* (2013.01); *H01L 21/31111* (2013.01); *H01L 21/31144* (2013.01)

(58) Field of Classification Search
CPC ........................... G03F 7/425; H01L 21/31144
USPC ................... 430/316, 317, 318, 323
See application file for complete search history.

(56) References Cited

U.S. PATENT DOCUMENTS

| | | | | |
|---|---|---|---|---|
| 7,816,068 B2* | 10/2010 | Huang | ..................... | G03F 7/094 430/270.1 |
| 8,871,432 B2* | 10/2014 | Minegishi | ................. | G03F 7/11 430/322 |
| 9,136,122 B2* | 9/2015 | Hatakeyama | ........... | G03F 7/094 |
| 2005/0074695 A1 | 4/2005 | Nakamura et al. | | |
| 2006/0134547 A1* | 6/2006 | Huang | ..................... | G03F 7/091 430/270.1 |
| 2013/0280655 A1* | 10/2013 | Higashihara | ........... | C08G 14/04 430/270.1 |
| 2013/0341304 A1* | 12/2013 | Minegishi | ............. | C08F 220/18 216/47 |
| 2014/0186774 A1* | 7/2014 | Glodde | ................. | G03F 7/0755 430/323 |

FOREIGN PATENT DOCUMENTS

| | | |
|---|---|---|
| JP | 2006-208658 A | 8/2006 |
| JP | 2009-175465 A | 8/2009 |
| JP | 2009-241300 A | 10/2009 |
| JP | 2010-085912 A | 4/2010 |
| JP | 2010-515107 A | 5/2010 |
| JP | 2010-139764 A | 6/2010 |
| JP | 2012-511742 A | 5/2012 |
| JP | 2012-192724 A | 10/2012 |
| JP | 2015-028145 A | 2/2015 |
| TW | 200416482 A | 9/2004 |
| WO | WO 2008/081416 A2 | 7/2008 |
| WO | WO 2012/043403 A1 | 4/2012 |
| WO | WO 2014/038680 A1 | 3/2014 |

OTHER PUBLICATIONS

International Search Report dated Jun. 2, 2015, in PCT/JP2015/056437 filed Mar. 4, 2015 (w/ English translation).
Office Action dated Aug. 21, 2018 in Japanese Patent Application No. 2016-510193 (w/ computer-generated English translation).
Combined Office Action and Search Report dated Jul. 17, 2018 in Taiwanese Patent Application No. 104109181, (with English translation), 8 pages.

* cited by examiner

Primary Examiner — John S Chu
(74) Attorney, Agent, or Firm — Oblon, McClelland, Maier & Neustadt, L.L.P.

(57) ABSTRACT

A pattern-forming method comprises: forming a resist underlayer film on an upper face side of a substrate; forming a silicon-containing film on an upper face side of the resist underlayer film; and removing the silicon-containing film with a basic aqueous solution. The pattern-forming method does not include, after the forming of the silicon-containing film and before the removing of the silicon-containing film, treating the silicon-containing film with a treatment liquid comprising an acid or a fluorine compound. The silicon-containing film is preferably formed a hydrolytic condensation product of a composition containing a compound represented by formula (1) in an amount of no less than 60 mol % with respect to total silicon compounds. X represents a halogen atom or —OR², and R² represents a monovalent organic group.

$$SiX_4 \qquad (1)$$

18 Claims, No Drawings

PATTERN-FORMING METHOD

CROSS-REFERENCE TO RELATED APPLICATIONS

The present application is a continuation application of International Application No. PCT/JP2015/056437, filed Mar. 4, 2015, which claims priority to Japanese Patent Application No. 2014-060959, filed Mar. 24, 2014. The contents of these applications are incorporated herein by reference in their entirety.

BACKGROUND OF THE INVENTION

Field of the Invention

The present invention relates to a pattern-forming method.

Discussion of the Background

In the field of manufacture of semiconductors and the like, a reduction in pattern size has progressed by utilizing a multilayer resist process in order to achieve a higher degree of integration. In the multilayer resist process, an inorganic film such as a silicon-containing film is first formed on a substrate, and a resist film that differs in etching selectivity from the inorganic film is formed on the inorganic film using a resist composition and the like. Then, a mask pattern is transferred through an exposure, and a development with a developer solution is carried out, whereby a resist pattern is obtained. Subsequently, the resist pattern is transferred to the inorganic film by dry etching, and the pattern of the inorganic film is finally transferred to the substrate, whereby a desired patterned substrate is obtained.

In an actual manufacture process of the semiconductor and the like, in a case where defects are generated in patterning of the silicon-containing film and/or the resist film, refabrication may be carried out. In regard to the refabrication, in the case of the inorganic film being a silicon-containing film, in order to remove the silicon-containing film, a wet removal method in which a treatment with an alkaline removing liquid is carried out after a step of a treatment with an acidic removing liquid containing a sulfate ion and/or a fluorine ion (see Japanese Unexamined Patent Application, Publication No. 2010-139764), wet removal that involves the use of a wet removal composition containing a fluoride source and an ammonium salt (see Japanese Unexamined Patent Application (Translation of PCT Application), Publication No. 2010-515107) or the use of concentrated aqueous hydrogen fluoride, as well as dry removal (see Japanese Unexamined Patent Application, Publication No. 2010-85912), and the like have been proposed.

SUMMARY OF THE INVENTION

According to an aspect of the present invention, a pattern-forming method comprises: forming a resist underlayer film on an upper face side of a substrate; forming a silicon-containing film on an upper face side of the resist underlayer film; forming a resist pattern on an upper face side of the silicon-containing film; etching the silicon-containing film using the resist pattern as a mask; and removing the silicon-containing film with a basic aqueous solution. The pattern-forming method does not include, after the forming of the silicon-containing film and before the removing of the silicon-containing film, treating the silicon-containing film with a treatment liquid comprising an acid or a fluorine compound.

DESCRIPTION OF THE EMBODIMENTS

According to an embodiment of the invention, a pattern-forming method includes: the step of forming a resist underlayer film on an upper face side of a substrate (hereinafter, may be also referred to as "resist underlayer film-forming step"); the step of forming a silicon-containing film on an upper face side of the resist underlayer film (hereinafter, may be also referred to as "silicon-containing film-forming step"); the step of forming a resist pattern on an upper face side of the silicon-containing film (hereinafter, may be also referred to as "resist pattern-forming step"); the step of etching the silicon-containing film using the resist pattern as a mask (hereinafter, may be also referred to as "etching step"); and the step of removing the silicon-containing film with a basic aqueous solution (hereinafter, may be also referred to as "silicon-containing film-removing step").

According to the pattern-forming method of the embodiment of the present invention, the silicon-containing film can be removed without using an acidic removing liquid or fluorine compound which may cause a severe damage to the substrate, whether before or after etching. Thus, the silicon-containing film can be formed again and the refabrication is enabled. Therefore, the pattern-forming method can be applied to manufacture of semiconductor devices in which further progress of miniaturization is expected in the future. Hereinafter, the embodiments of the present invention will be described in detail.

Pattern-Forming Method

A pattern-forming method according to an embodiment of the present invention includes the resist underlayer film-forming step, the silicon-containing film-forming step, and the silicon-containing film-removing step. Typically, the pattern-forming method includes the resist pattern-forming step and the etching step after the silicon-containing film-forming step and before the silicon-containing film-removing step. However, the pattern-forming method does not include, after the silicon-containing film-forming step and before the silicon-containing film-removing step, the step of treating the silicon-containing film with a treatment liquid containing an acid or a fluorine compound.

According to the pattern-forming method, since the basic aqueous solution is used, the silicon-containing film can be removed without using an acidic removing liquid or fluorine compound which may cause a severe damage to the substrate, whether before or after etching. Therefore, the silicon-containing film can be formed again and the refabrication is enabled. Hereinafter, each step will be described.

Resist Underlayer Film-Forming Step

In this step, a resist underlayer film is formed on an upper face side of a substrate. Examples of the substrate include insulating films such as silicon oxide, silicon nitride, silicon nitride oxide and polysiloxane, as well as interlayer insulating films such as wafers coated with a low-dielectric insulating film such as "Black Diamond" available from AMAT, "SILK" available from Dow Chemical and "LKD5109" available from JSR Corporation, which are commercially available products. Polysilicon, and metal gate films, as generally referred to, produced by implanting a metal component into the polysilicon and the like are also included. A substrate patterned so as to have wiring grooves (trenches), plug grooves (vias) or the like may also be used as the substrate.

Examples of the resist underlayer film include: an organic film formed from a composition for resist underlayer film formation; a carbon film formed according to a conventionally well-known chemical vapor deposition (CVD) technique; and the like. Conventionally well-known compositions for resist underlayer film formation may be used as the composition for resist underlayer film formation, and examples thereof include NFC HM8005 available from JSR Corporation, and the like. The resist underlayer film may formed by applying the composition for resist underlayer film formation on the substrate to provide a coating film thereof, and subjecting the coating film to a heating treatment, or irradiation with ultraviolet light and a heating treatment to harden the coating film. The application procedure of the composition for resist underlayer film formation is exemplified by spin coating, roll coating, dip coating, and the like. The lower limit of the heating temperature is preferably 150° C., and more preferably 180° C. The upper limit of the heating temperature is preferably 500° C., and more preferably 350° C. The lower limit of the heating time period is preferably 30 sec, and more preferably 45 sec. The upper limit of the heating time period is preferably 1,200 sec, and more preferably 600 sec. The lower limit of the average thickness of the resist underlayer film is preferably 50 nm. The upper limit of the average thickness is preferably 500 nm.

In addition, other underlayer film distinct from the resist underlayer film may be formed on the top face of the substrate or on the resist underlayer film. The other underlayer film is a film to which a reflection-preventing function, coating film flatness, superior etching resistance against fluorine-containing gases such as $CF_4$ and/or the like are/is imparted. The other underlayer film may be formed by using, for example, a commercially available product such as NFC SOG01 available from JSR Corporation.

Silicon-Containing Film-Forming Step

In this step, a silicon-containing film is formed on an upper face side of the resist underlayer film. The silicon-containing film may be formed by, for example, applying a composition for silicon-containing film formation and the like onto an upper face side of the resist underlayer film. The composition for silicon-containing film formation will be described later. The application procedure of the composition for silicon-containing film formation is exemplified by spin-coating, cast coating, roll coating, and the like. It is to be noted that the lower limit of the average thickness of the formed silicon-containing film is preferably 10 nm, and more preferably 20 nm. The upper limit of the average thickness of the formed silicon-containing film is preferably 1,000 nm, more preferably 500 nm, and still more preferably 300 nm.

Composition for Silicon-Containing Film Formation

The composition for silicon-containing film formation contains (A) polysiloxane and (B) an organic solvent. The composition for silicon-containing film formation may also contain other optional component such as a crosslinking accelerator as a favorable component within a range not leading to impairment of the effects of the present invention. Hereinafter, each component will be described.

(A) Polysiloxane

The structure of the polysiloxane (A) is not particularly limited, and the polysiloxane (A) is preferably a hydrolytic condensation product of a compound including a silane compound represented by the following formula (2) (hereinafter, may be also referred to as "silane compound (a)"). When such polysiloxane (A) is used, the pattern collapse resistance of the formed resist pattern can be improved, and additionally the resulting silicon-containing film can be removed more effectively in the silicon-containing film-removing step described later.

$$R^1_a SiX_{4-a} \quad (2)$$

In the above formula (2), $R^1$ represents a hydrogen atom, a fluorine atom, an alkyl group having 1 to 5 carbon atoms, a cyano group, a cyanoalkyl group, an alkylcarbonyloxy group, an acid anhydride group, an alkenyl group, an aryl group or an aralkyl group, wherein the alkyl group may be substituted with a fluorine atom, and the aryl group and the aralkyl group may be substituted; X represents a halogen atom or $-OR^2$, wherein $R^2$ represents a monovalent organic group; and a is an integer of 0 to 3, wherein in a case where $R^1$ and X are each present in a plurality of number, a plurality of $R^1$s may be identical or different and a plurality of Xs may be identical or different.

Examples of the alkyl group having 1 to 5 carbon atoms which may be represented by $R^1$ include:

linear alkyl groups such as a methyl group, an ethyl group, a n-propyl group, a n-butyl group and a n-pentyl group;

branched alkyl groups such as an isopropyl group, an isobutyl group, a sec-butyl group, a t-butyl group and an isoamyl group; and the like.

Examples of the fluorine atom-substituted alkyl group having 1 to 5 carbon atoms, which may be represented by $R^1$, include a fluoromethyl group, a difluoromethyl group, a trifluoromethyl group, a fluoroethyl group, a difluoroethyl group, a trifluoroethyl group, a perfluoroethyl group, a perfluoro-n-propyl group, a hexafluoro-i-propyl group, a perfluorobutyl group, and the like.

Examples of the cyanoalkyl group which may be represented by $R^1$ include a cyanoethyl group, a cyanopropyl group, and the like.

Examples of the alkylcarbonyloxy group which may be represented by $R^1$ include a methylcarbonyloxy group, an ethylcarbonyloxy group, a propylcarbonyloxy group, a butylcarbonyloxy group, and the like.

Examples of the alkenyl group which may be represented by $R^1$ include a group represented by the following formula (i-1), and the like.

$$CH_2=CH-(CH_2)_n-* \quad (i-1)$$

In the above formula (i-1), n is an integer of 0 to 4; and * denotes a binding site.

In the above formula (i-1), n is preferably 0 or 1, and more preferably 0 (i.e., vinyl group).

Examples of the aryl group which may be represented by $R^1$ include a phenyl group, a naphthyl group, a methylphenyl group, an ethylphenyl group, and the like.

Examples of the aralkyl group which may be represented by $R^1$ include a benzyl group, a phenylethyl group, a phenylpropyl group, a naphthylmethyl group, and the like.

Examples of the substituent which may be included in the aryl group or the aralkyl group include halogen atoms such as a fluorine atom, a chlorine atom, a bromine atom and an iodine atom, a hydroxyl group, a carboxyl group, a cyano group, a nitro group, an alkoxy group, an aryloxy group, an acyl group, an amino group, a substituted amino group, and the like.

Examples of the halogen atom which may be represented by X include a fluorine atom, a chlorine atom, and the like.

Examples of the monovalent organic group represented by $R^2$ in $-OR^2$ include alkyl groups having 1 to 4 carbon atoms such as a methyl group, an ethyl group, a n-propyl group, an isopropyl group, a n-butyl group, an isobutyl group, a sec-butyl group and a t-butyl group, and the like.

In the formula (2), a is preferably an integer of 0 to 2.

The silane compound (a) is exemplified by: trifunctional silane compounds such as aromatic ring-containing trialkoxysilanes, alkyltrialkoxysilanes, alkyltriaryloxysilanes, alkenyltrialkoxysilanes, alkyltrihalogenosilanes and acid anhydride group-containing trialkoxysilanes; tetrafunctional silane compounds such as tetraalkoxysilanes, tetraaryloxysilanes and tetrahalogenosilanes; and the like.

Specific examples of the aromatic ring-containing trialkoxysilane include phenyltrimethoxysilane, benzyltrimethoxysilane, phenethyltrimethoxysilane, methylphenyltrimethoxysilane, ethylphenyltrimethoxysilane, methoxyphenyltrimethoxysilane, phenoxyphenyltrimethoxysilane, hydroxyphenyltrimethoxysilane, aminophenyltrimethoxysilane, dimethylaminophenyltrimethoxysilane, acetylaminophenyltrimethoxysilane, 2,4,6-trimethylphenyltrimethoxysilane, methylbenzyltrimethoxysilane, ethylbenzyltrimethoxysilane, methoxybenzyltrimethoxysilane, phenoxybenzyltrimethoxysilane, hydroxybenzyltrimethoxysilane, aminobenzyltrimethoxysilane, dimethylaminobenzyltrimethoxysilane, acetylaminobenzyltrimethoxysilane, and the like.

Specific examples of the alkyltrialkoxysilane include methyltrimethoxysilane, methyltriethoxysilane, methyltris(dimethylsiloxy)silane, methyltris(methoxyethoxy)silane, ethyltrimethoxysilane, ethyltriethoxysilane, and the like.

Specific examples of the alkenyltrialkoxysilane include vinyltrimethoxysilane, vinyltriethoxysilane, allyltrimethoxysilane, allyltriethoxysilane, and the like.

Specific examples of the acid anhydride group-containing trialkoxysilane include (trimethoxysilyl)ethylsuccinic anhydride, (triethoxysilyl)propylsuccinic anhydride, and the like.

Specific examples of other trifunctional silane compound include methyltriacetoxysilane, methyltrichlorosilane, ethyltriacetoxysilane, ethyltrichlorosilane, methyltriphenoxysilane, ethyltriphenoxysilane, vinyltriphenoxysilane, allyltriphenoxysilane, and the like.

Specific examples of the tetrafunctional silane compound include:

tetraalkoxysilanes such as tetramethoxysilane, tetraethoxysilane, tetra-n-propoxysilane, tetra-iso-propoxysilane, tetra-n-butoxysilane, tetra-sec-butoxysilane and tetra-tert-butoxysilane;

tetraphenoxysilane, and tetrachlorosilane; and the like.

Of these, in light of the removability of the silicon-containing film, aromatic ring-containing silane compounds and acid anhydride group-containing silane compounds are preferred, and phenyltrialkoxysilanes and (triethoxysilyl)propylsuccinic anhydride are more preferred.

Examples of other silane compound which may be used, as needed, as the silane compound for obtaining the polysiloxane (A) include:

disilanes such as hexamethoxydisilane, hexaethoxydisilane, hexaphenoxydisilane, 1,1,1,2,2-pentamethoxy-2-methyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,2-dimethoxy-1,1,2,2-tetramethyldisilane, 1,2-diethoxy-1,1,2,2-tetramethyldisilane and 1,2-diphenoxy-1,1,2,2-tetramethyldisilane;

bissilyl group-containing silanes such as bis(trimethoxysilyl)methane, bis(triethoxysilyl)methane, 1-(dimethoxymethylsilyl)-1-(trimethoxysilyl)methane, 1-(diethoxymethylsilyl)-1-(triethoxysilyl)methane, bis(dimethoxymethylsilyl)methane, bis(diethoxymethylsilyl)methane, bis(dimethylmethoxysilyl)methane, bis(dimethylethoxysilyl)methane, 1-(dimethoxymethylsilyl)-2-(trimethylsilypethane and 1-(diethoxymethylsilyl)-2-(trimethylsilyl)ethane;

disilanes such as 1,2-bis(trimethoxysilyl)benzene, 1,2-bis(triethoxysilyl)benzene, 1,4-bis(trimethoxysilyl)benzene and 1,4-bis(triethoxysilyl)benzene;

polycarbosilanes such as polydimethoxymethylcarbosilane and polydiethoxymethylcarbosilane; and the like. These silane compounds may be used either of one type alone, or at least two types thereof may be used in combination.

One, or two or more types of the polysiloxane (A) may be contained in the composition for silicon-containing film formation.

The lower limit of the polystyrene equivalent weight average molecular weight (Mw) of the polysiloxane (A) as determined by gel permeation chromatography (GPC) is preferably 1,000, more preferably 1,200, and still more preferably 1,500. The upper limit of the Mw is preferably 20,000, more preferably 15,000, and still more preferably 7,000. It is to be noted that the Mw as used herein is determined by gel permeation chromatography using mono-dispersed polystyrene as a standard substance. Specific measurement conditions will be described later.

A well-known method for hydrolytic condensation may be used for the method for hydrolytic condensation of the silane compound (a), and other silane compound used as needed.

The lower limit of the content of the polysiloxane (A) with respect to the total solid content of the composition for silicon-containing film formation is preferably 70% by mass, more preferably 80% by mass, and still more preferably 90% by mass.

Organic Solvent (B)

The composition for silicon-containing film formation contains the organic solvent (B). The organic solvent (B) is not particularly limited as long as it can dissolve or disperse the polysiloxane (A) and an optional component described later.

The organic solvent (B) is exemplified by an alcohol solvent, a ketone solvent, an amide solvent, an ether solvent, an ester solvent, a hydrocarbon solvent, a mixed solvent thereof, and the like. These solvents may be used either alone of one type, or two or more types thereof may be used in combination.

Examples of the alcohol solvent include:

aliphatic monohydric alcohols solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partial ether solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone:

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as butyl acetate, ethyl lactate and butoxymethyl acetate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Among these organic solvents (B), propylene glycol monomethyl ether, propylene glycol monoethyl ether, and propylene glycol monomethyl ether acetate are preferred.

Optional Component

Crosslinking Accelerator

The crosslinking accelerator is a compound that is capable of accelerating crosslinking reaction between the molecular chains of the polysiloxane (A) or within the molecular chain thereof, in forming the silicon-containing film from the composition for silicon-containing film formation, for example. The crosslinking accelerator is not particularly limited as long as it has the aforementioned property, and conventionally well-known crosslinking accelerators may be used; examples thereof include acids, bases, metal complexes, metal salt compounds, onium salt compounds, and the like. The crosslinking accelerator may be used either alone of one type, or in combination of two or more types thereof.

The composition for silicon-containing film formation may further contain, in addition to the components described above, an acid generating agent, a base generating agent, a surfactant, β-diketone, colloidal silica, colloidal alumina, an organic polymer, and the like, as an optional component.

Preparation Method of Composition for Silicon-Containing Film Formation

The composition for silicon-containing film formation may be obtained by, for example, mixing the polysiloxane (A), the organic solvent (B) and the optional component as needed, and dissolving or dispersing the mixture in the organic solvent (B). The lower limit of the solid content concentration of the composition for silicon-containing film formation is preferably 0.5% by mass, and more preferably 1% by mass. The upper limit of the solid content concentration of the composition for silicon-containing film formation is preferably 20% by mass, more preferably 15% by mass, and still more preferably 10% by mass.

The lower limit of the contact angle of pure water on the silicon-containing film is preferably 40°, and particularly preferably 45°. The upper limit of the contact angle is preferably 80°, and particularly preferably 75°. It is to be noted that the contact angle as referred to herein is measured at 25° C., unless otherwise specified particularly. When the contact angle on the silicon-containing film falls within the above range, favorable wet spreadability of a basic aqueous solution in the silicon-containing film-removing step described later, and/or favorable adhesiveness of the resist pattern typically formed on the silicon-containing film can be exhibited.

The silicon-containing film is preferably formed from a hydrolytic condensation product of a composition containing a compound represented by the following formula (1) in an amount of no less than 60 mol % with respect to the total silicon compounds.

$$SiX_4 \qquad (1)$$

In the above formula (1), X represents a halogen atom or —OR², wherein R² represents a monovalent organic group.

More specifically, the silicon-containing film is preferably formed from a hydrolytic condensation product of a compound including a tetrafunctional silane monomer in an amount of no less than 60 mol %. It is to be noted that the tetrafunctional silane monomer as referred to herein means a silane monomer having four hydrolyzable groups on the silicon atom. The hydrolyzable group is exemplified by an alkoxy group, an aryloxy group, a halogeno group, and the like. The trifunctional silane monomer, the to bifunctional silane monomer, and the like are similarly defined with respect to each corresponding number of hydrolyzable groups.

After the composition for silicon-containing film formation is applied, prebaking (PB) may be carried out to evaporate a solvent in the coating film, as needed. The PB temperature may be appropriately selected depending on the formulation of the composition, and the lower limit thereof is preferably 50° C. The upper limit of the PB temperature is preferably 450° C. The lower limit of the PB time period is preferably 5 sec. The upper limit of the PB time period is preferably 600 sec.

Silicon-Containing Film-Removing Step

In this step, the silicon-containing film is removed with a basic aqueous solution. The silicon-containing film-removing step is preferably carried out at a temperature of less than 100° C. The removal of the silicon-containing film in this step may be carried out through, for example, a treatment in which the substrate having the silicon-containing film formed thereon is immersed in a warmed basic aqueous solution. The lower limit of the temperature of the basic aqueous solution is preferably 30° C., more preferably 40° C., and still more preferably 50° C. The upper limit of the temperature of the basic aqueous solution is preferably 100° C., more preferably 95° C., and still more preferably 90° C. The lower limit of the immersion time period is preferably 1 sec, and more preferably 10 sec. The upper limit of the immersion time period is preferably 1 hour, and more preferably 30 min. Subsequently, rinsing with pure water and the like is carried out to eliminate the basic aqueous solution used.

The basic aqueous solution is exemplified by an aqueous solution containing at least one nitrogen compound selected from the group consisting of ammonia, an organic amine and a tetraalkylammonium, and the like. Specific examples of the basic aqueous solution include aqueous solutions of a nitrogen compound such as ammonia, methylamine, dimethylamine, trimethylamine, ethylamine, diethylamine, triethylamine, tetramethylammonium hydroxide and tetraethylammonium hydroxide, and the like. Preferably, the basic aqueous solution contains none of hydrogen fluoride, a salt thereof, and a salt of a fluorine compound.

In addition, the lower limit of the water content in the basic aqueous solution is preferably 40% by mass, more preferably 60% by mass, and still more preferably 80% by mass.

The lower limit of the concentration of the basic aqueous solution is preferably 0.1% by mass, and more preferably 0.5% by mass. The upper limit of the concentration of the basic aqueous solution is preferably 40% by mass, and more preferably 30% by mass.

Moreover, it is preferred that the basic aqueous solution further contains hydrogen peroxide in light of a further improvement of the removability of the silicon-containing film. In regard to the proportion of hydrogen peroxide contained, the lower limit of the mass ratio of hydrogen peroxide to the nitrogen compound in the basic aqueous solution is preferably 1/500. The upper limit of the mass ratio of hydrogen peroxide to the nitrogen compound in the basic aqueous solution is preferably 500.

The basic aqueous solution is preferably a liquid obtained by mixing ammonia, hydrogen peroxide and water. This liquid is not particularly limited as long as the liquid is obtained by mixing ammonia, hydrogen peroxide and water, and includes a liquid that is obtained by mixing ammonia, hydrogen peroxide and water but does not allow detection of ammonia and/or hydrogen peroxide due to a reaction of ammonia with hydrogen peroxide, and the like. In other words, the liquid obtained by mixing ammonia, hydrogen peroxide and water is preferably a liquid that contains water, with ammonia and hydrogen peroxide, and/or a reaction product of ammonia and hydrogen peroxide, and specific examples thereof include:

a liquid that contains ammonia, hydrogen peroxide and water;

a liquid that contains a reaction product of ammonia and hydrogen peroxide, ammonia and water;

a liquid that contains a reaction product of ammonia and hydrogen peroxide, hydrogen peroxide and water;

a liquid that contains a reaction product of ammonia and hydrogen peroxide, and water; and the like. Of these, a liquid that contains ammonia, hydrogen peroxide and water is preferred as the liquid obtained by mixing ammonia, hydrogen peroxide and water.

In a case where this step is carried out after the resist pattern-forming step described later, the resist film not patterned properly can be removed together with the silicon-containing film in removing the silicon-containing film, whereby refabrication such as re-formation of the silicon-containing film and the resist film, and the like is enabled. Alternatively, this step may be carried out after a pattern is formed on the silicon-containing film in the etching step described later. Since the silicon-containing film not patterned properly and the like can be thus removed in the aforementioned silicon-containing film-removing step, refabrication such as re-formation of the silicon-containing film and the resist film, and the like is enabled. Further, this step may be carried out after a pattern of the resist underlayer film is formed in the etching step described later, or after a pattern of the substrate is formed.

Resist Pattern-Forming Step

In this step, a resist pattern is formed on the silicon-containing film formed in the silicon-containing film-forming step. As the procedure for forming the resist pattern in this step, conventionally well-known procedures such as a procedure involving the use of a resist composition and a procedure involving the use of a nanoimprint lithography process, for example, can be employed.

Etching Step

In this step, the silicon-containing film is etched using the resist pattern as a mask such that the silicon-containing film has a pattern. According to the pattern-forming method, since the resist film not patterned properly and the silicon-containing film not patterned properly can be removed in the aforementioned silicon-containing film-removing step even after the etching, the silicon-containing film and the resist film can be re-formed, leading to formation of a pattern.

In this step, the step of further etching the resist underlayer film such that the resist underlayer film has a pattern may be included. Subsequently, since the silicon-containing film is removed in the aforementioned silicon-containing film-removing step, the substrate having the patterned resist underlayer film can be obtained, and with this substrate, pattern formation of the substrate is enabled.

In this step, the step of further etching the substrate may be included.

In the etching, one or more times of dry etching may be suitably carried out. The dry etching may be carried out using a well-known dry etching apparatus. As a source gas in the dry etching, oxygen atom-containing gases such as $O_2$, CO and $CO_2$, inert gases such as He, $N_2$ and Ar, chlorine-containing gases such as $Cl_2$ and $BCl_3$, fluorine-containing gases such as $CHF_3$ and $CF_4$, other gases such as $H_2$ and $NH_3$, and the like may be used depending on the elemental composition of the substance to be etched. It is to be noted that these gases may be used in combination.

EXAMPLES

Hereinafter, the present invention is explained in detail by way of Examples, but the present invention is not in any way limited to these Examples. Measuring methods for various types of physical properties are shown below.

Structure Confirmation of Compound (A)

The structure of the compound (A) was confirmed based on: the molecular weight thereof as determined by means of MALDI-TOF-MS ("SHIMAZU/KRATOS matrix-assisted laser desorption/ionization time-of-flight mass spectrometer KOMPACT MALDI IV tDE" available from Shimadzu Corporation); an infrared absorption spectrum (IR) recorded on FT-IR ("model 420" available from JASCO Corporation); and a $^1$H-NMR spectrum recorded on a nuclear magnetic resonance apparatus ("model JNM-ECA-500" available from JEOL, Ltd.) with a solvent for measurement of DMSO-d6.

Weight Average Molecular Weight (Mw)

The weight average molecular weight (Mw) was determined by gel permeation chromatography using monodispersed polystyrene as a standard. "G2000 HXL"×2 and "G3000 HXL"×1 available from Tosoh Corporation were used as GPC columns, a differential refractometer was used as a detector, and tetrahydrofuran was used as an eluent. The flow rate was 1.0 mL/min, and the column temperature was 40° C.

Synthesis of Compound

Synthesis Example 1: Synthesis of (A-1)

Into a 1,000 mL three-neck eggplant shaped flask were charged 13.28 g of butyl acrylate and 75 g of methyl isobutyl ketone (MIBK). A flask for dropwise addition was separately provided, in which 54.22 g of 2-vinylnaphthalene, 32.50 g of vinylbenzyl alcohol, and 11.91 g of a radical polymerization initiator ("V-601" available from Wako Pure Chemical Industries, Ltd.) were dissolved in 75 g of MIBK. The mixture was added dropwise over 3 hrs at the flask temperature of 80° C., and thereafter the resulting mixture was aged for 3 hrs. Then, the flask was cooled until the temperature of the solution reached room temperature. Thereafter, the solution was added dropwise to five times the mass of heptane, followed by filtration, whereby 50.5 g of a compound (A-1) as a white powder was obtained.

Synthesis Example 2: Synthesis of (A-2)

Into a 1,000 mL three-neck eggplant shaped flask were charged 35 g of resorcinol, 39 g of acetaldehyde and 450 g of ethanol, and dissolution was attained at room temperature in a nitrogen atmosphere. To the resulting solution was added dropwise 95.6 g of concentrated hydrochloric acid over 1 hour at the solution temperature of 40° C., and the solution temperature was elevated to 80° C. followed by aging at that temperature for 11 hrs. After the aging, the flask was cooled until the solution temperature reached room temperature. Thereafter, the reddish brown solid matter precipitated was collected by filtration to remove the ethanol solution. Washing with a flowing mixed solution of methanol and water (each 300 g) was carried out, followed by drying at 60° C. overnight under reduced pressure, whereby 45.6 g of brown solid matter having a hydroxy group as a terminal group was obtained. $^1$H-NMR confirmed that an intended precursor Y was obtained.

Next, in a 500 mL round-bottom flask, 10.0 g of the precursor Y thus obtained was dissolved in 200 mL of N,N-dimethylacetamide in a nitrogen atmosphere with stirring with a magnetic stirrer. After 20.0 g of chloromethylstyrene was added to the resulting solution under stirring, 28.4 g of potassium carbonate was further added, and the reaction was allowed at 80° C. for 18 hrs. After the completion of the reaction, the reaction solution was added to 2 L of water to which 14 mL of acetic acid was added. The supernatant liquid was removed, and the residual highly viscous matter was dissolved in a minimum amount of acetone, followed by charging into 500 mL of water to permit reprecipitation. The highly viscous matter obtained thus was dried at 65° C. overnight under reduced pressure, whereby 10.5 g of a polymer (A-2) as a brownish yellow solid was obtained.

Synthesis Example 3: Synthesis of (A-3)

An aqueous oxalic acid solution was prepared by mixing 23.87 g of 10% by mass oxalic acid and 14.34 g of water. Thereafter, a flask containing 55.24 g of tetraethoxysilane, 7.01 g of phenyltrimethoxysilane, 16.14 g of 3-(triethoxysilyl)propylsuccinic anhydride and 33.39 g of methanol was equipped with a condenser, and a dropping funnel containing the aqueous oxalic acid solution prepared as described above. Subsequently, after the flask was heated to 60° C. with an oil bath, the aqueous oxalic acid solution was slowly added dropwise, and the reaction was allowed at 60° C. for 4 hrs. After the completion of the reaction, the flask containing the reaction solution was allowed to cool, then substitution with propylene glycol monomethyl ether acetate was carried out, and methanol was removed on an evaporator, whereby 473 g of a resin solution was obtained. The solid matter in this resin solution was designated as polysiloxane (A-3). The proportion of the solid matter contained in the resin solution thus obtained was determined by a baking method, and consequently found to be 7.5% by mass. In addition, the polysiloxane (A-3) had the Mw of 2,000.

Synthesis Example 4: Synthesis of (A-4)

An aqueous oxalic acid solution was prepared by mixing 31.10 g of 10% by mass oxalic acid and 9.35 g of water. Thereafter, a flask containing 64.07 g of tetraethoxysilane, 12.89 g of methyltrimethoxysilane, 14.07 g of phenyltrimethoxysilane and 68.53 g of methanol was equipped with a condenser, and a dropping funnel containing the aqueous oxalic acid solution prepared as described above. Subsequently, after the flask was heated to 60° C. with an oil bath, the aqueous oxalic acid solution was slowly added dropwise, and the reaction was allowed at 60° C. for 4 hrs. After the completion of the reaction, the flask containing the reaction solution was allowed to cool, then substitution with propylene glycol monomethyl ether acetate was carried out, and methanol was removed on an evaporator, whereby 262 g of a resin solution was obtained. The solid matter in this resin solution was designated as polysiloxane (A-4). The proportion of the solid matter contained in the resin solution thus obtained was determined by a baking method, and consequently found to be 7.5% by mass. In addition, the polysiloxane (A-4) had the Mw of 1,800.

Synthesis Example 5: Synthesis of (A-5)

Into a 1,000 mL glass flask were charged 200 g of methanol, 200 g of ion exchanged water, and 1 g of 35% by mass hydrochloric acid, and to this was added a mixture of 50 g of tetraethoxysilane, 100 g of methyltrimethoxysilane and 10 g of phenyltrimethoxysilane at room temperature. The hydrolytic condensation was directly permitted at room temperature for 8 hrs, and then 300 mL of propylene glycol monoethyl ether was added, followed by concentration under reduced pressure to obtain 300 g of a resin solution (polymer concentration: 21% by mass). The solid matter in this resin solution was designated as polysiloxane (A-5). In addition, the polysiloxane (A-5) had the Mw of 2,000.

Synthesis Example 6: Synthesis of (A-6)

Into a 1,000 mL glass flask were charged 200 g of methanol, 200 g of ion exchanged water, and 1 g of 35% by mass hydrochloric acid, and to this was added a mixture of 100 g of methyltrimethoxysilane and 20 g of phenyltrimethoxysilane at room temperature. The hydrolytic condensation was directly permitted at room temperature for 8 hrs, and then 300 mL of propylene glycol monoethyl ether was added, followed by concentration under reduced pressure to obtain 300 g of a resin solution (polymer concentration: 19% by mass). The solid matter in this resin solution was designated as polysiloxane (A-6). In addition, the polysiloxane (A-6) had the Mw of 3,000.

Synthesis Example 7: Synthesis of (A-7)

A mixture of 260 g of ion exchanged water, 5 g of 65% by mass nitric acid, 70 g of tetramethoxysilane, 70 g of methyltrimethoxysilane, and 10 g of phenyltrimethoxysilane was added at room temperature. The hydrolytic condensation was directly permitted at room temperature for 8 hrs, and then 300 mL of butanediol monomethyl ether was added, followed by concentration under reduced pressure to obtain 300 g of a resin solution (polymer concentration: 20% by mass). The solid matter in this resin solution was designated as polysiloxane (A-7). In addition, the polysiloxane (A-7) had the Mw of 2,500.

Preparation of Composition

Each component used in the preparation of the composition for resist underlayer film formation or the composition for silicon-containing film formation is shown below.

(B) Organic Solvent
B-1: propylene glycol monomethyl ether acetate
B-2: propylene glycol monoethyl ether
B-3: butanediol monomethyl ether (D) Acid Generating Agent
D-1: bis(4-t-butylphenyl)iodonium nonafluoro-n-butanesulfonate (a compound represented by the following formula (D-1))

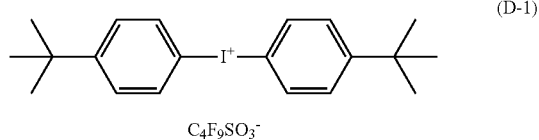

(E) Crosslinking Agent
E-1: 1,3,4,6-tetrakis(methoxymethyl)glycoluril (a compound represented by the following formula (E-1))

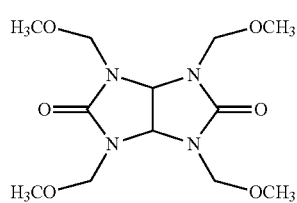

filtered through a membrane filter having a pore size of 0.1 μm, whereby a composition for resist underlayer film formation (U-1) was prepared.

Synthesis Example 9: Preparation of Composition for Resist Underlayer Film Formation (U-2)

A composition for resist underlayer film formation (U-2) was prepared in a similar manner to Synthesis Example 8 except that the type and content of the components used were as specified in Table 1 below. It is to be noted that "–" in Table 1 indicates the absence of the corresponding component.

Synthesis Example 10: Preparation of Composition for Silicon-Containing Film Formation (U-3)

A mixed solution was obtained by dissolving 2 parts by mass of (A-3) obtained in Synthesis Example 3 in 98 parts by mass of propylene glycol monoethyl ether (organic solvent (B-2)). Thereafter, this mixed solution was filtered through a membrane filter having a pore size of 0.1 μm, whereby a composition for silicon-containing film formation (U-3) was prepared.

Synthesis Examples 11 to 14

Preparation of Compositions for Silicon-Containing Film Formation (U-4) to (U-7)

Compositions for silicon-containing film formation (U-4) to (U-7) were prepared in a similar manner to Synthesis Example 10 except that the type and content of the components used were as specified in Table 1 below. It is to be noted that "–" in Table 1 indicates the absence of the corresponding component.

TABLE 1

| | Composition | Compound type | Compound content (parts by mass) | (B) Organic solvent type | (B) Organic solvent content (parts by mass) | (D) Acid generating agent type | (D) Acid generating agent content (parts by mass) | (E) Crosslinking agent type | (E) Crosslinking agent content (parts by mass) |
|---|---|---|---|---|---|---|---|---|---|
| Synthesis Example 8 | U-1 | A-1 | 5 | B-1 | 95 | D-1 | 5 | E-1 | 10 |
| Synthesis Example 9 | U-2 | A-2 | 5 | B-1 | 95 | — | — | — | — |
| Synthesis Example 10 | U-3 | A-3 | 2 | B-1 | 98 | — | — | — | — |
| Synthesis Example 11 | U-4 | A-4 | 2 | B-1 | 98 | — | — | — | — |
| Synthesis Example 12 | U-5 | A-5 | 2 | B-2 | 98 | — | — | — | — |
| Synthesis Example 13 | U-6 | A-6 | 2 | B-2 | 98 | — | — | — | — |
| Synthesis Example 14 | U-7 | A-7 | 2 | B-3 | 98 | — | — | — | — |

Synthesis Example 8: Preparation of Composition for Resist Underlayer Film Formation (U-1)

A mixed solution was obtained by dissolving 5 parts by mass of (A-1) obtained in Synthesis Example 1 in 95 parts by mass of propylene glycol monomethyl ether acetate (organic solvent (B-1)). Thereafter, this mixed solution was Formation of Resist Underlayer Film and Silicon-Containing Film Examples 1 to 4 and Comparative Examples 1 to 3

Each composition for resist underlayer film formation and each composition for silicon-containing film formation which were prepared as described above were applied onto a silicon wafer (substrate) according to a spin coating procedure. Thereafter, each "substrate having a resist underlayer film and a silicon-containing film" was obtained in an ambient air atmosphere under the baking condition specified in Table 2.

TABLE 2

|  | Composition for resist underlayer film formation | Underlayer film baking (° C./60 sec) | Composition for silicon-containing film formation | SOG baking (° C./60 sec) |
|---|---|---|---|---|
| Example 1 | U-1 | 250 | U-3 | 220 |
| Example 2 | U-2 | 250 | U-3 | 220 |
| Example 3 | U-1 | 250 | U-4 | 220 |
| Example 4 | U-2 | 250 | U-4 | 220 |
| Comparative Example 1 | U-1 | 250 | U-5 | 200 |
| Comparative Example 2 | U-1 | 250 | U-6 | 200 |
| Comparative Example 3 | U-2 | 250 | U-7 | 200 |

Evaluations

Evaluations for the following items were made according to the following methods using each substrate obtained as described above. The results of the evaluations are shown in Table 3.

Contact Angle (°)

A contact angle of pure water on the silicon-containing film of each substrate obtained as described above was measured at 25° C.

Solvent Resistance

Each substrate obtained as described above was immersed in cyclohexanone (at room temperature) for 10 sec. The average thickness of the film was measured before and after the immersion using a spectroscopic ellipsometer ("UV 1280E" available from KLA-TENCOR), and a rate of change of the film thickness was calculated from the measurement values. The rate of change of the film thickness was calculated according to the following formula (a):

rate of change of film thickness (%)=100×(absolute value of the difference between the average thickness of the film after immersion and the average thickness of the film before immersion)/(the average thickness of the film before immersion) (a)

The solvent resistance was evaluated to be: "A" (favorable) in the case of the rate of change of the film thickness being less than 1%; and "B" (unfavorable) in the case of the rate of change of the film thickness being no less than 1%.

TMAH Developer Solution Resistance

Each substrate obtained as described above was immersed in a 2.38% by mass TMAH developer solution (at room temperature) for 60 sec. The average thickness of the film was measured before and after the immersion using a spectroscopic ellipsometer ("UV 1280E" available from KLA-TENCOR), and a rate of change of the film thickness was calculated from the measurement values. The rate of change of the film thickness was calculated according to the above formula (a). The TMAH developer solution resistance was evaluated to be: "A" (favorable) in the case of the rate of change of the film thickness being less than 1%; and "B" (unfavorable) in the case of the rate of change of the film thickness being no less than 1%.

Solubility in TMAH Developer Solution at High Temperature

Each substrate obtained as described above was immersed for 5 min in a 2.38% by mass TMAH developer solution warmed to 80° C. The substrate was observed with cross sectional SEM before and after the immersion, and the solubility in the TMAH developer solution was evaluated to be: "A" (favorable) in the case of only the underlayer remaining; and "B" (unfavorable) in the case of the silicon-containing film remaining.

Solubility in Alkaline Removing Liquid

Each substrate obtained as described above was immersed for 5 min in an alkaline removing liquid A (a mixed aqueous solution of 25% by mass aqueous ammonia solution/30% by mass aqueous hydrogen peroxide solution/water (volume ratio: 25% by mass aqueous ammonia solution/30% by mass aqueous hydrogen peroxide solution/water=1/1/5)) warmed to 65° C. The substrate was observed with cross sectional SEM before and after the immersion, and the solubility in alkaline removing liquid was evaluated to be: "A" (favorable) in the case of only the underlayer remaining; and "B" (unfavorable) in the case of the silicon-containing film remaining.

TABLE 3

|  | Contact angle (°) | Solvent resistance | TMAH resistance (room temperature) | Solubility in alkaline removing liquid A (65° C.) | Solubility in TMAH (80° C.) |
|---|---|---|---|---|---|
| Example 1 | 68 | A | A | A | A |
| Example 2 | 68 | A | A | A | A |
| Example 3 | 71 | A | A | A | A |
| Example 4 | 71 | A | A | A | A |
| Comparative Example 1 | 81 | A | A | B | B |
| Comparative Example 2 | 83 | A | A | B | B |
| Comparative Example 3 | 76 | A | A | B | B |

As demonstrated by the results shown in Table 3, according to the pattern-forming method of the embodiment of the present invention, the silicon-containing film can be removed with the TMAH developer solution, or the basic aqueous solution containing the aqueous ammonia solution as a component without using an acidic removing liquid or fluorine compound which may cause a severe damage to the substrate.

According to the pattern-forming method of the embodiment of the present invention, the silicon-containing film can be removed without using an acidic removing liquid or fluorine compound which may cause a severe damage to the substrate, whether before or after etching. Thus, the silicon-containing film can be formed again and the refabrication is enabled. Therefore, the pattern-forming method can be applied to manufacture of semiconductor devices in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
forming a resist underlayer film on an upper face side of a substrate;
forming a silicon-containing film on an upper face side of the resist underlayer film;
forming a resist pattern on an upper face side of the silicon-containing film;
dry etching the silicon-containing film using the resist pattern as a mask; and
removing the silicon-containing film with a basic aqueous solution,
wherein when the resist pattern remains before the removing of the silicon-containing film, the resist pattern is removed together with the silicon-containing film in the removing of the silicon-containing film,
wherein a concentration of the basic aqueous solution is from 0.1% by mass to 40% by mass,
wherein the pattern-forming method does not comprise, after the forming of the silicon-containing film and before the removing of the silicon-containing film, treating the silicon-containing film with a treatment liquid comprising an acid or a fluorine compound, and
wherein the silicon-containing film is formed from a hydrolytic condensation product of a composition comprising a compound represented by formula (1) in an amount of no less than 60 mol % with respect to total silicon compounds,

$$SiX_4 \quad (1)$$

wherein, in the formula (1), X represents a halogen atom or —OR², wherein R² represents a monovalent organic group.

2. The pattern-forming method according to claim 1, wherein the basic aqueous solution is a liquid comprising tetraalkylammonium hydroxide and water, or a liquid obtained by mixing ammonia, hydrogen peroxide and water.

3. The pattern-forming method according to claim 1, wherein the basic aqueous solution comprises none of hydrogen fluoride, a salt thereof, and a salt of a fluorine compound.

4. The pattern-forming method according to claim 1, wherein the removing of the silicon-containing film is carried out at a temperature of less than 100° C.

5. The pattern-forming method according to claim 1, wherein the silicon-containing film is formed from a composition comprising:
a hydrolytic condensation product of a silane compound comprising a compound represented by formula (2); and
an organic solvent,

$$R^1{}_aSiX_{4-a} \quad (2)$$

wherein, in the formula (2),
R¹ represents a hydrogen atom, a fluorine atom, an alkyl group having 1 to 5 carbon atoms, a cyano group, a cyanoalkyl group, an alkylcarbonyloxy group, an acid anhydride group, an alkenyl group, an aryl group or an aralkyl group, wherein the alkyl group is unsubstituted or substituted with a fluorine atom, and the aryl group and the aralkyl group are unsubstituted or substituted;
X represents a halogen atom or —OR², wherein R² represents a monovalent organic group; and
a is an integer of 0 to 3, wherein in a case where R' and X are each present in a plurality of number, a plurality of R's are identical or different and a plurality of Xs are identical or different.

6. The pattern-forming method according to claim 5, wherein the silane compound comprises an aromatic ring.

7. The pattern-forming method according to claim 5, wherein the silane compound comprises the acid anhydride group.

8. A pattern-forming method comprising:
forming a resist underlayer film on an upper face side of a substrate;
forming a silicon-containing film on an upper face side of the resist underlayer film;
forming a resist pattern on an upper face side of the silicon-containing film;
dry etching the silicon-containing film using the resist pattern as a mask; and
removing the silicon-containing film with a basic aqueous solution which comprises ammonia, hydrogen peroxide and water, at a temperature of less than 100° C.,
wherein when the resist pattern remains before the removing of the silicon-containing film, the resist pattern is removed together with the silicon-containing film in the removing of the silicon-containing film,
wherein a concentration of the basic aqueous solution is from 0.1% by mass to 40% by mass,
wherein the pattern-forming method does not comprise, after the forming of the silicon-containing film and before the removing of the silicon-containing film, treating the silicon-containing film with a treatment liquid comprising an acid or a fluorine compound and
wherein the silicon-containing film is formed from a hydrolytic condensation product of a composition comprising a compound represented by formula (1) in an amount of no less than 60 mol % with respect to total silicon compounds,

$$SiX_4 \quad (1)$$

wherein, in the formula (1), X represents a halogen atom or —OR², wherein R² represents a monovalent organic group.

9. The pattern-forming method according to claim 1, wherein a weight average molecular weight (Mw) of a polysiloxane included in the silicon-containing film as determined by gel permeation chromatography (GPC) is from 1,000 to 20,000.

10. The pattern-forming method according to claim 1, wherein a weight average molecular weight (Mw) of a polysiloxane included in the silicon-containing film as determined by gel permeation chromatography (GPC) is from 1,000 to 7,000.

11. The pattern-forming method according to claim 1, wherein the concentration of the basic aqueous solution is from 0.5% by mass to 30% by mass.

12. The pattern-forming method according to claim 8, wherein the basic aqueous solution comprises none of hydrogen fluoride, a salt thereof, and a salt of a fluorine compound.

13. The pattern-forming method according to claim 8, wherein the silicon-containing film is formed from a composition comprising:
a hydrolytic condensation product of a silane compound comprising a compound represented by formula (2); and
an organic solvent,

$$R^1{}_aSiX_{4-a} \quad (2)$$

wherein, in the formula (2),
R¹ represents a hydrogen atom, a fluorine atom, an alkyl group having 1 to 5 carbon atoms, a cyano group, a cyanoalkyl group, an alkylcarbonyloxy group, an acid anhydride group, an alkenyl group, an aryl group or an aralkyl group, wherein the alkyl group is unsubstituted or substituted with a fluorine atom, and the aryl group and the aralkyl group are unsubstituted or substituted;

X represents a halogen atom or —$OR^2$, wherein $R^2$ represents a monovalent organic group; and a is an integer of 0 to 3, wherein in a case where $R^1$ and X are each present in a plurality of number, a plurality $R^1$s are identical or different and a plurality of Xs are identical or different.

14. The pattern-forming method according to claim 13, wherein the silane compound comprises an aromatic ring.

15. The pattern-forming method according to claim 13, wherein the silane compound comprises the acid anhydride group.

16. The pattern-forming method according to claim 8, wherein a weight average molecular weight (Mw) of a polysiloxane included in the silicon-containing film as determined by gel permeation chromatography (GPC) is from 1,000 to 20,000.

17. The pattern-forming method according to claim 8, wherein a weight average molecular weight (Mw) of a polysiloxane included in the silicon-containing film as determined by gel permeation chromatography (GPC) is from 1,000 to 7,000.

18. The pattern-forming method according to claim 8, wherein the concentration of the basic aqueous solution is from 0.5% by mass to 30% by mass.

* * * * *

UNITED STATES PATENT AND TRADEMARK OFFICE
CERTIFICATE OF CORRECTION

PATENT NO. : 10,234,762 B2
APPLICATION NO. : 15/267840
DATED : March 19, 2019
INVENTOR(S) : Masayoshi Ishikawa et al.

It is certified that error appears in the above-identified patent and that said Letters Patent is hereby corrected as shown below:

In the Claims

Column 17, Line 64 and Line 66, Claim 5, "R'" should read -- $R^1$ --.

Signed and Sealed this
Twenty-third Day of July, 2019

Andrei Iancu
*Director of the United States Patent and Trademark Office*